United States Patent
Cheng et al.

(10) Patent No.: US 9,893,181 B1
(45) Date of Patent: Feb. 13, 2018

(54) UNIFORM GATE LENGTH IN VERTICAL FIELD EFFECT TRANSISTORS

(71) Applicant: International Business Machines Corporation, Armonk, NY (US)

(72) Inventors: Kangguo Cheng, Schenectady, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/586,370

(22) Filed: May 4, 2017

Related U.S. Application Data

(62) Division of application No. 15/292,423, filed on Oct. 13, 2016, now Pat. No. 9,728,635.

(51) Int. Cl.
| | |
|---|---|
| *H01L 29/78* | (2006.01) |
| *H01L 29/10* | (2006.01) |
| *H01L 27/088* | (2006.01) |
| *H01L 29/08* | (2006.01) |
| *H01L 29/66* | (2006.01) |
| *H01L 21/8234* | (2006.01) |

(52) U.S. Cl.
CPC .. *H01L 29/7827* (2013.01); *H01L 21/823487* (2013.01); *H01L 27/088* (2013.01); *H01L 29/0847* (2013.01); *H01L 29/1037* (2013.01); *H01L 29/6656* (2013.01); *H01L 29/66666* (2013.01)

(58) Field of Classification Search
CPC ........... H01L 29/7827; H01L 29/66666; H01L 29/6656; H01L 29/6653; H01L 29/1037; H01L 29/0847; H01L 21/3065; H01L 27/088; H01L 21/823487; H01L 21/3081
See application file for complete search history.

(56) References Cited

U.S. PATENT DOCUMENTS

2016/0293756 A1* 10/2016 Liu ..................... H01L 29/7827

OTHER PUBLICATIONS

List of IBM Patents or Patent Applications Treated as Related; (Appendix P), filed May 4, 2017; 2 pages.
Kangguo Cheng et al., "Uniform Gate Length in Vertical Field Effect Transistors", U.S. Appl. No. 15/292,423, filed Oct. 13, 2016.

* cited by examiner

*Primary Examiner* — Selim Ahmed
(74) *Attorney, Agent, or Firm* — Cantor Colburn LLP; Vazken Alexanian

(57) ABSTRACT

A method of fabricating a vertical field effect transistor includes forming a base layer on a doped layer that is formed on a substrate, and forming fin hard masks above the base layer. Spacers are formed adjacent to each side of each of the fin hard masks above the base layer. A width dimension of each of the spacers is the same. Gaps between the spacers are filled with oxide prior to removing the spacers. The spacers are removed to leave gaps of the same width on each side of each of the fin hard masks. An etch in the gaps forms a plurality of fins below the fin hard masks. A height dimension of each of the plurality of fins is the same and a space between two of the plurality of fins is different than a second space between two others of the plurality of fins.

20 Claims, 13 Drawing Sheets

UNIFORM GATE LENGTH IN VERTICAL FIELD EFFECT TRANSISTORS

This application is a division of U.S. patent application Ser. No. 15/292,423 filed Oct. 13, 2016, the disclosure of which is incorporated herein by reference in its entirety.

BACKGROUND

The present invention relates to the fabrication of a field effect transistor (FET), and more specifically, to obtaining uniform get length in vertical FETs (VFETs).

A FET is a three-terminal device that includes a source, drain, and gate. Generally, a FET is fabricated with the source and drain formed on the same lateral level such that current flow, which is controlled by the gate in the channel region between the source and drain regions, is horizontal. In the efforts to scale complementary metal-oxide semiconductor (CMOS) technologies to 5 nanometers and beyond, non-planar FET architectures such as fin-type FETs (finFETs) and vertical FETs (VFETs) have been pursued. In a finFET, the source, drain and channel regions are built as a three-dimensional fin, which serves as the body of the device. The gate electrode is wrapped over the top and sides of the fin, and the portion of the fin that is under the gate electrode functions as the channel. In a VFET, the channel is also formed in a three-dimensional fin. However, the gate in a VFET extends along and/or around the vertical sidewalls of the fin. As a result, current flow in the channel region is vertical rather than horizontal.

SUMMARY

According to one or more embodiments of the present invention, a method of fabricating a vertical field effect transistor (VFET) includes forming a doped layer on a substrate, forming a base layer on the doped layer, and forming fin hard masks above the base layer. A space between two of the fin hard masks is different than a second space between two others of the fin hard masks. Uniform spacers are formed adjacent to each side of each of the fin hard masks above the base layer. A width dimension of each of the uniform spacers is substantially the same. First gaps between the uniform spacers are filled with oxide prior to removing the uniform spacers. Removing the uniform spacers leaves second gaps of substantially the same width on each side of each of the fin hard masks. An etch in the second gaps forms a plurality of fins below the fin hard masks. A height dimension of each of the plurality of fins is substantially the same and a space between two of the plurality of fins is different than a second space between two others of the plurality of fins.

According to one or more embodiments, a structure of a vertical field effect transistor (VFET) includes a substrate, and a doped layer formed on the substrate. A top surface of the doped layer is non-uniform. A plurality of fins is formed above the doped layer. A space between two of the plurality of fins is different than another space between another two of the plurality of fins. Gate metal is formed adjacent to each side of each of the plurality of fins. A height of the gate metal directly adjacent to each side of each of the plurality of fins is substantially the same.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-13 show cross-sectional views of intermediate structures involved in the formation of a finFET with uniform fin height, in which:

FIG. 1 is a cross-sectional view of an intermediate structure with fin hard masks formed on a base;

FIG. 2 shows the intermediate structure that results from forming spacers formed on each side of each fin hard mask;

FIG. 3 is the result of performing an oxide fill in the gaps shown above the base in the structure shown in FIG. 2;

FIG. 4 is a cross-sectional view of an intermediate structure that results from stripping of the spacers from the structure shown in FIG. 3;

FIG. 5 is a cross-sectional view of an intermediate structure that results from a fin etch process;

FIG. 6 is a cross-sectional view of an intermediate structure that results from filling the trenches shown in FIG. 6 with a hard mask material;

FIG. 7 results from an oxide strip to remove the oxide above the base in the structure shown in FIG. 6;

FIG. 8 shows the result of etching the base and part of the doped layer below the base while retaining the fins and the hard mask buffer adjacent to the fins;

FIG. 9 is a cross-sectional view of the intermediate structure resulting from removal of the hard mask adjacent to each fin;

FIG. 10 shows the intermediate structure that results from the formation of a bottom spacer on the remaining doped layer;

FIG. 11 is a cross-sectional view of the intermediate structure that results from the formation of a metal layer on the bottom spacer;

FIG. 12 is a cross-sectional view of the intermediate structure that results from the formation of a top spacer on the metal layer; and FIG. 13 shows the cross-sectional view of an intermediate structure of a VFET with a layer deposited for formation of drain regions above the fins.

DETAILED DESCRIPTION

As previously noted, several non-planar FET architectures, such as finFETs and VFETs, have fin-shaped channel regions between the source and drain regions. Fin formation is one of the processes performed during the fabrication of the FETs. Fin pitch refers to the distance from an edge of a fin to the same edge of an adjacent fin. The phrase "pitch walking" refers to the fact that the pitch between different sets of adjacent fins is unlikely to be precisely the same. Pitch walking results from the sideways image transfer process (e.g., from self-aligned double patterning (SADP)) used in fin formation. A consequence of pitch walking can be non-uniform fin heights. Pitch walking is an issue in all fin-based FETs. In some cases, different fin pitches can be required by a design need (e.g., in different devices). In VFETs, the non-uniform channel height that can result from pitch walking and variable fin pitch design can cause device failure. This is because the same conditions that result in non-uniform fin heights because of pitch walking will also result in the gate lengths directly adjacent to each fin being different. This results in poor control by the gates in the channel region.

Turning now to an overview of aspects of the present invention, one or more embodiments relate to forming spacers on either side of each fin hard mask pattern to define a uniform distance adjacent to each fin hard mask pattern. This spacer-defined uniform distance or uniform width is then used to form trenches around the fins that are the same depth. These trenches, in turn, facilitate obtaining fins of the same height. As a consequence, the gate length directly adjacent to each side of each fin (i.e., channel region) is the same.

Figure 1:
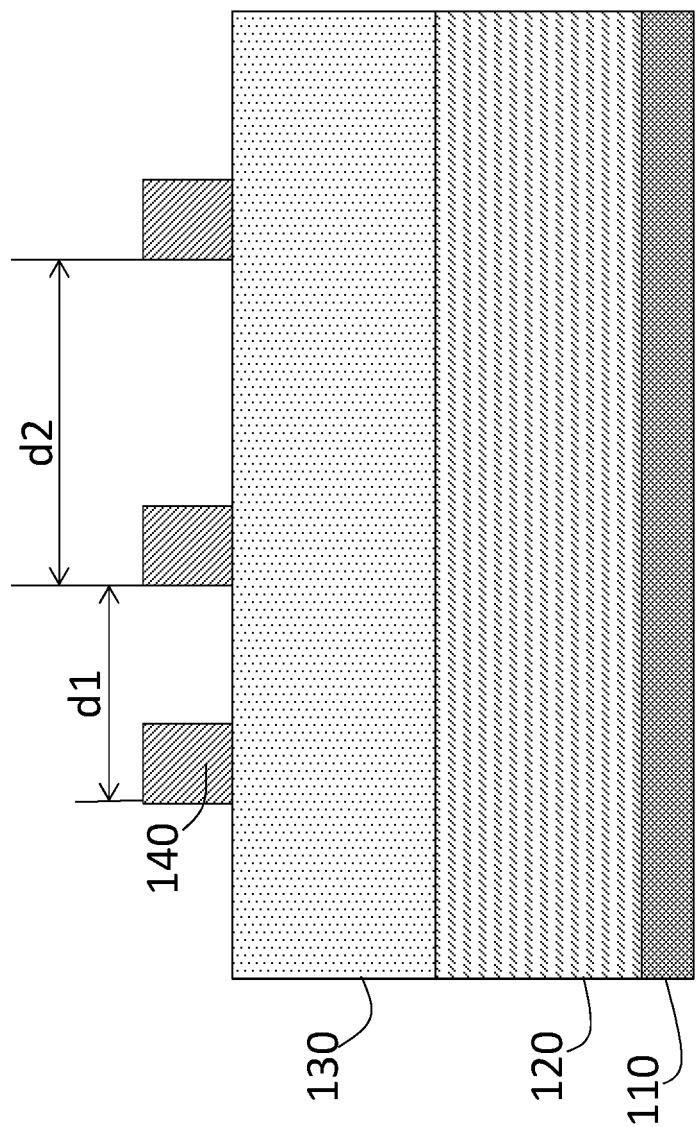

Turning now to a more detailed description of one or more embodiments, FIGS. 1-13 show cross-sectional views of intermediate structures involved in the formation of a FET with uniform fin height. FIG. 10-13 are associated with one or more embodiments that are specific to the formation of a VFET. FIG. 1 is a cross-sectional view of an intermediate structure with fin hard masks 140 formed on a base 130 (e.g., silicon (Si)). The fin hard masks 140 result from a known patterning of a fin hard mask 140 layer. The fin hard mask 140 is a material that is resistant to the etch process used to etch the base 130 to form the fins 510 (FIG. 5). The fin hard mask 140 can be silicon nitride (SiN), silicon dioxide (SiO$_2$), or a high k metal oxide dielectric (e.g., titanium oxide (TiO$_2$), hafnium oxide (HfO$_2$), or aluminum oxide (Al$_2$O$_3$)), for example. As FIG. 1 indicates, the distance d1 between two adjacent fin hard masks 140 is different than the distance d2 between two other adjacent fin hard masks 140. This difference illustrates the pitch walking that was previously discussed. The base 130 is formed on a doped layer 120 (e.g., nitrogen (N+)) that is formed on a substrate 110. The doped layer 120 forms the source region or, in alternate embodiments, the drain region of the device.

The substrate 110 is a silicon substrate, for example. The base 130 is a fin channel material which can include bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 110 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 110 can also include an organic semiconductor or a layered semiconductor such as, for example, Si/SiGe, a silicon-on-insulator or a SiGe-on-insulator. A portion or entire semiconductor substrate 110 can be amorphous, polycrystalline, or monocrystalline. In addition to the aforementioned types of semiconductor substrates 110, the semiconductor substrate 110 can also include a hybrid oriented (HOT) semiconductor substrate in which the HOT substrate has surface regions of different crystallographic orientation. The semiconductor substrate 110 can be doped, undoped, or contain doped regions and undoped regions therein. The semiconductor substrate 110 can contain regions with strain and regions without strain therein, or contain regions of tensile strain and compressive strain. In one or more embodiments, the substrate 110 can be a semiconductor-on-insulator (SOI) substrate. The substrate 110 can further include other structures (not shown) such as shallow trench isolation (STI), fins, nanowires, nanosheets, resistors, capacitors, etc.

Figure 2:
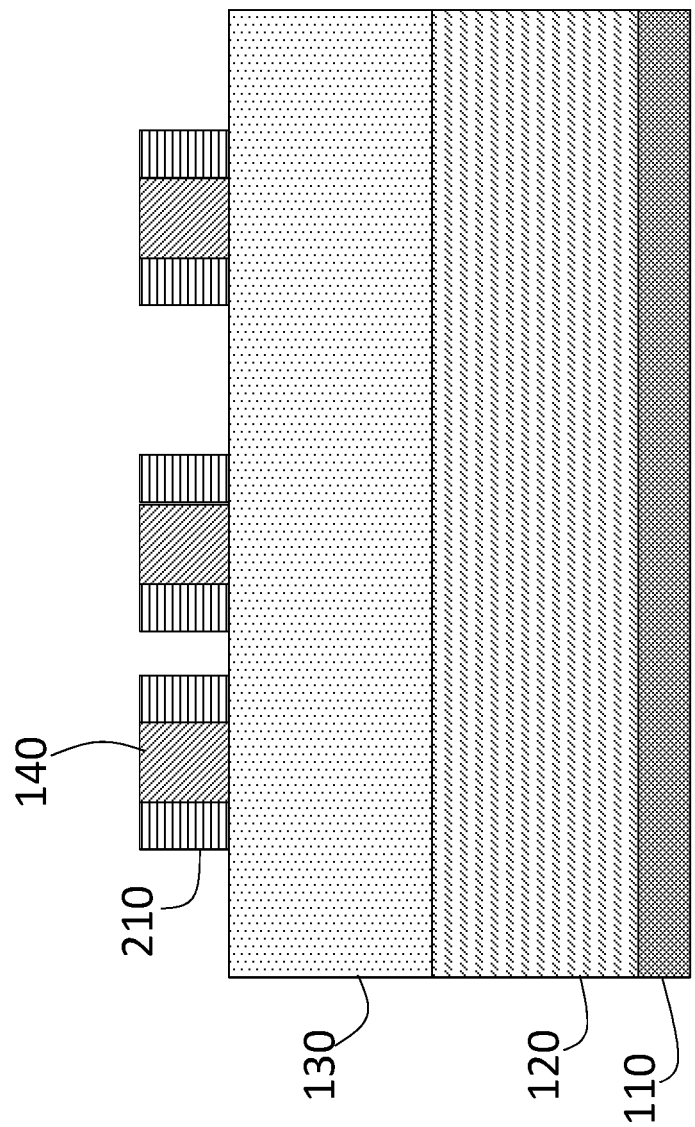

FIG. 2 results from the formation of spacers 210 on each side of each fin hard mask 140 shown in FIG. 1. The spacers 210 can be amorphous carbon (aC). The spacers 210 result from a conformal coating of the spacer material followed by etching such as by a reactive ion etch (ME) process. The intermediate structure shown in FIG. 3 results from an oxide 310 fill in the gaps left adjacent to the spacers 210 in the intermediate structure shown in FIG. 2. A planarization, such as a chemical mechanical planarization (CMP), can be performed on the oxide 310.

Figure 3:
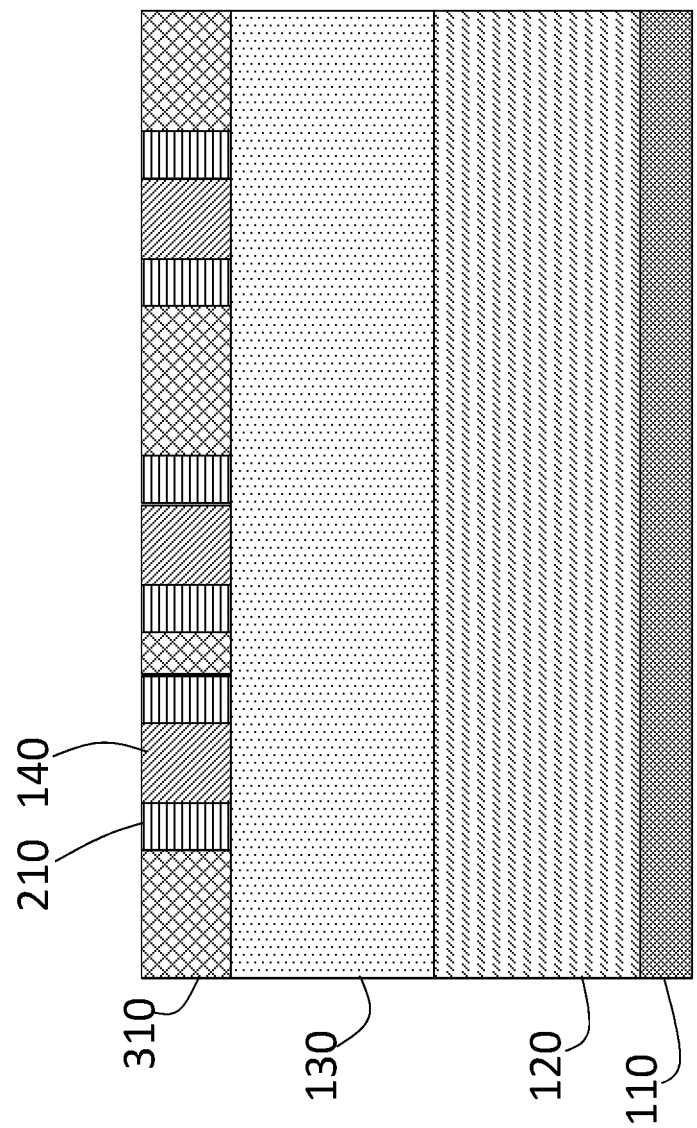
Figure 4:
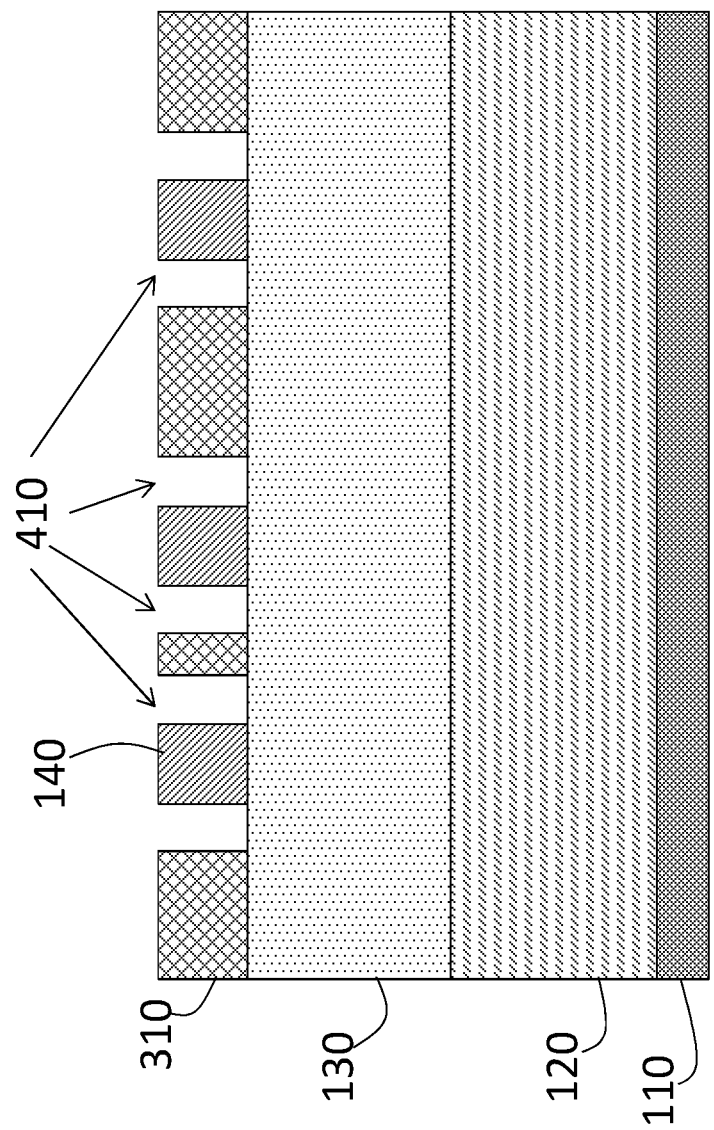
Figure 5:
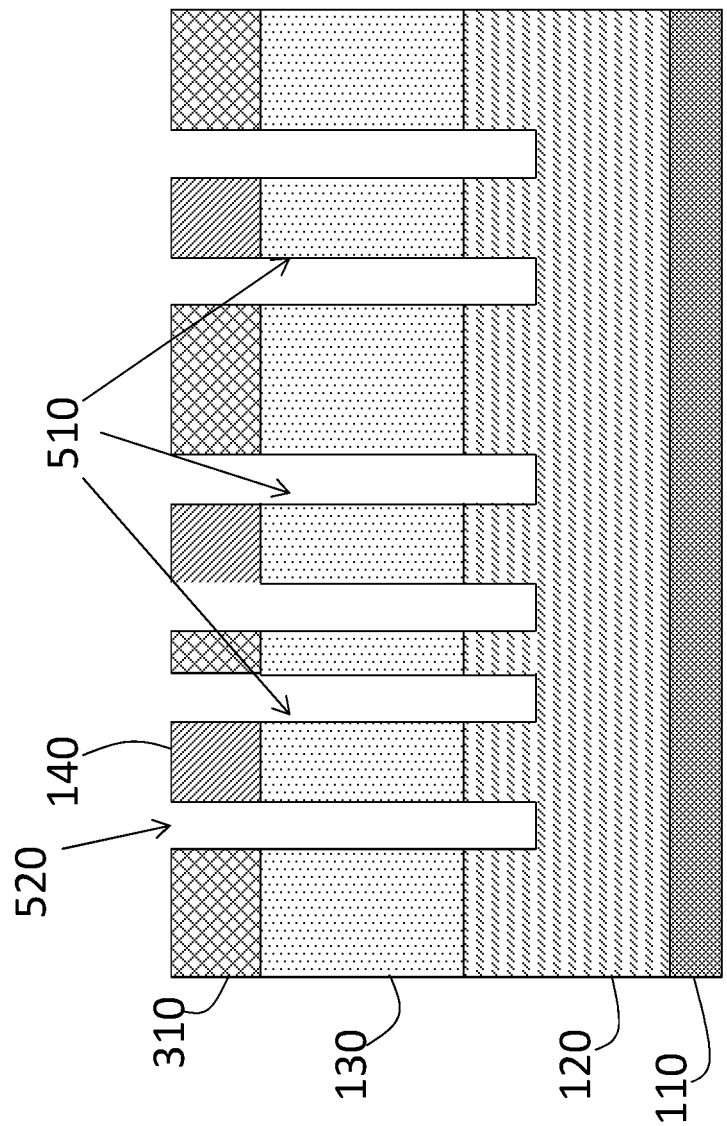

FIG. 4 is a cross-sectional view of an intermediate structure that results from stripping of the spacers 210 from the structure shown in FIG. 3. A isotropic etch (e.g., RIE) can be performed to remove the spacers 210. As FIG. 4 indicates, based on the width of each of the removed spacers 210 being the same, the width of the gap 410 around each fin hard mask 140, which results from the removal of the spacers 210, is the same.

FIG. 5 is a cross-sectional view of an intermediate structure that results from a fin 510 etch process. The portions of the base 130 with the surface uncovered by either the fin hard mask 140 or the oxide 310 are etched through, as is part of the doped layer 120. This results in trenches 520 of the same depth being formed on each side of each fin 510. That is, the uniformity of the spacers 210 (i.e., their thickness being the same) facilitates uniform height of the fins 510. This is because the depth of the etch performed using the RIE process is a function of the width of the space being etched. As FIG. 4 indicates, the space on either side of each fin hard mask 140 is exactly the same width because of the uniform spacers 210. As a result, the depth of each trench 520 and, consequently, the height of each fin 510 is the same.

Figure 6:
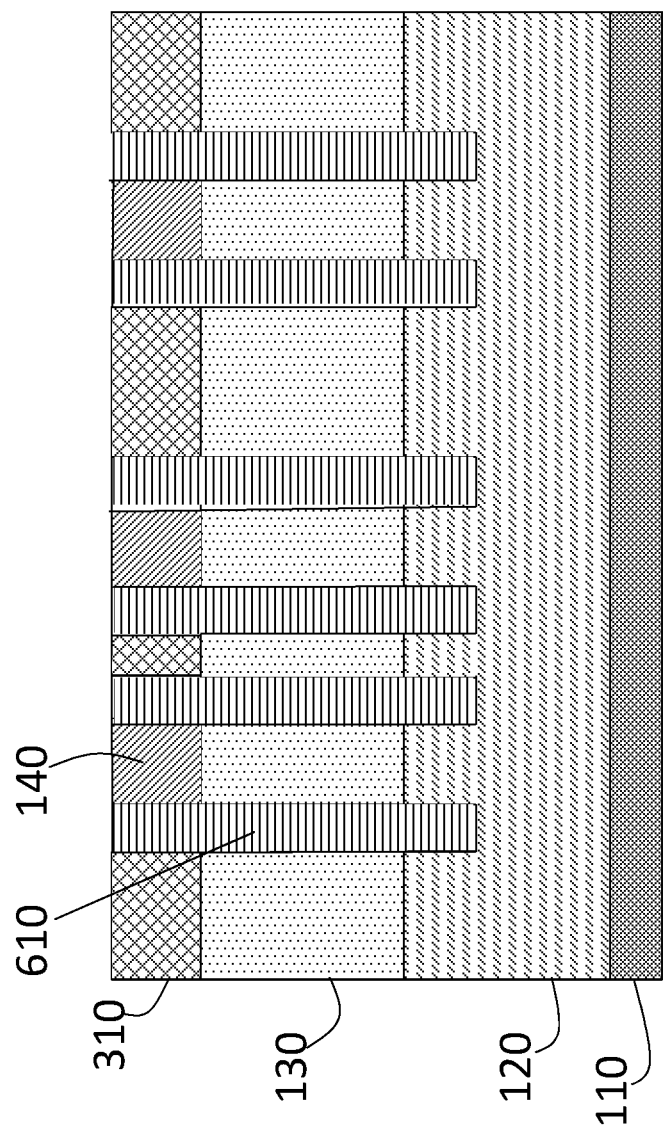

The trenches 520 in the structure shown in FIG. 5 are filled with a hard mask 610 to result in the intermediate structure shown in FIG. 6. The hard mask 610 can be the same material as the fin hard mask 140 according to one or more embodiments.

Figure 7:
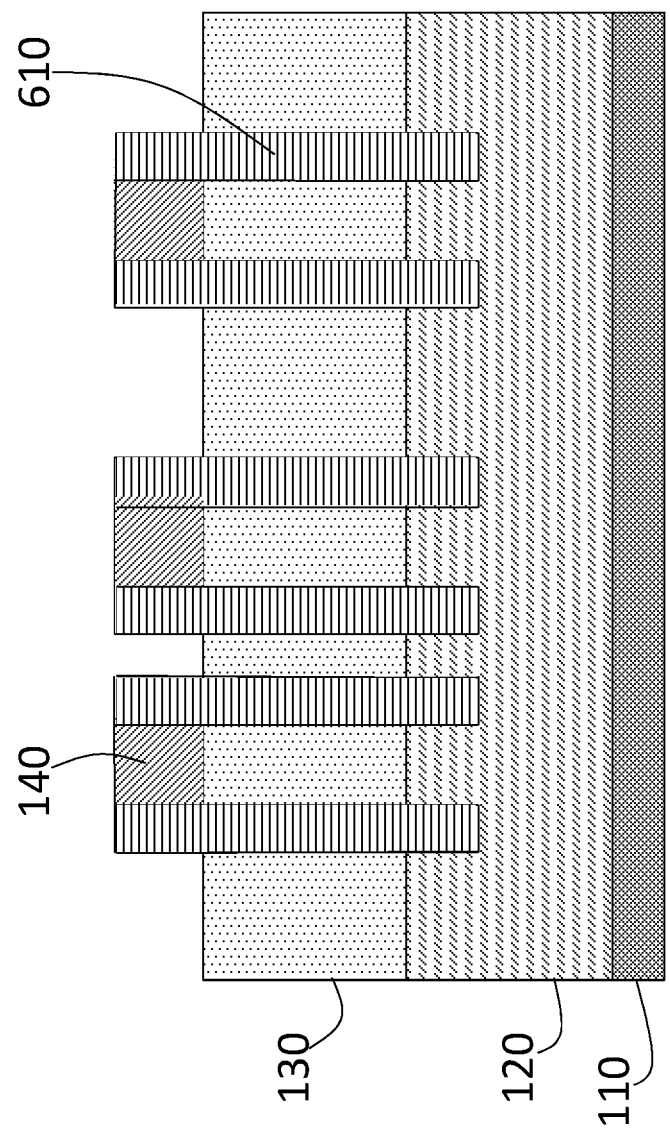
Figure 8:
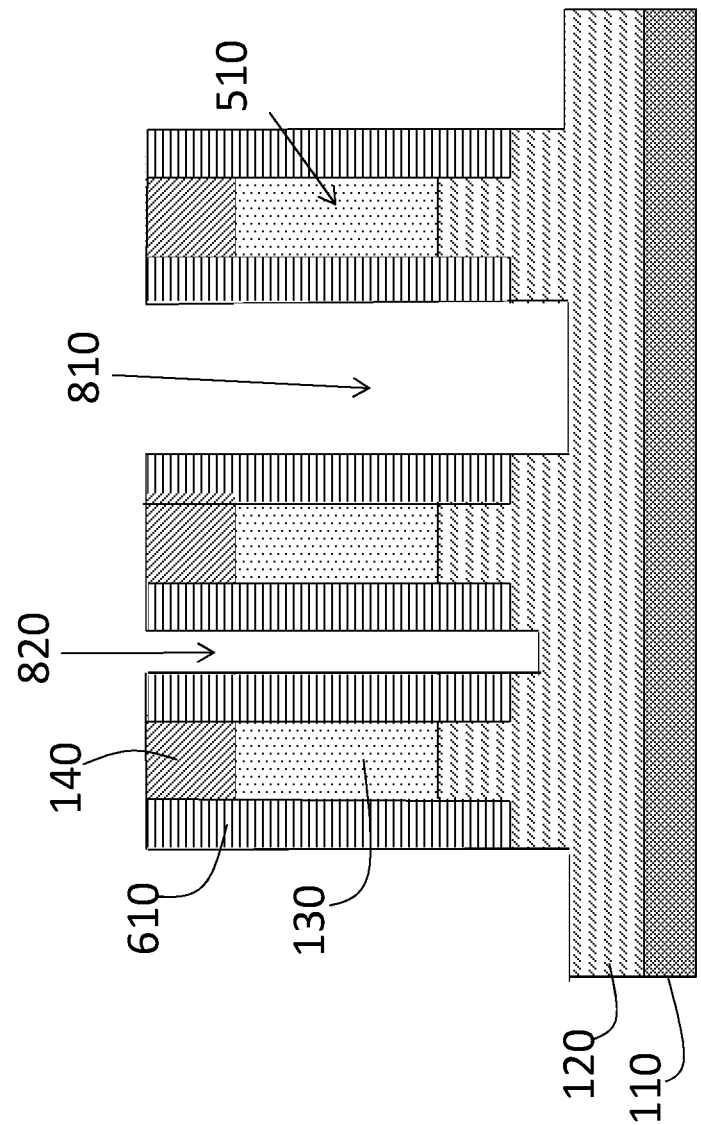

An oxide 310 strip results in the intermediate structure shown in FIG. 7. This is followed by an etch (e.g., RIE process) of the base 130 and part of the doped layer 120 to result in the intermediate structure shown in FIG. 8. As FIG. 8 indicates, the etch results in non-uniform recessing of the doped layer 120. This non-uniform etching illustrates the issue that is addressed by the uniform spacers 210. The trench 810 is deeper than the trench 820 because the trench 810 is wider than the trench 820. When the RIE process is performed to form the fins 510, the space left by the uniform spacers 210 (see e.g., FIG. 4) is the same width adjacent to each fin hard mask 140. Thus, the depth of each trench 510 is the same. The RIE process that results in the structure shown in FIG. 8 does not affect the fins 510, because the fins 510 are buffered by the hard masks 140 above and the hard masks 610 on each side.

Figure 9:
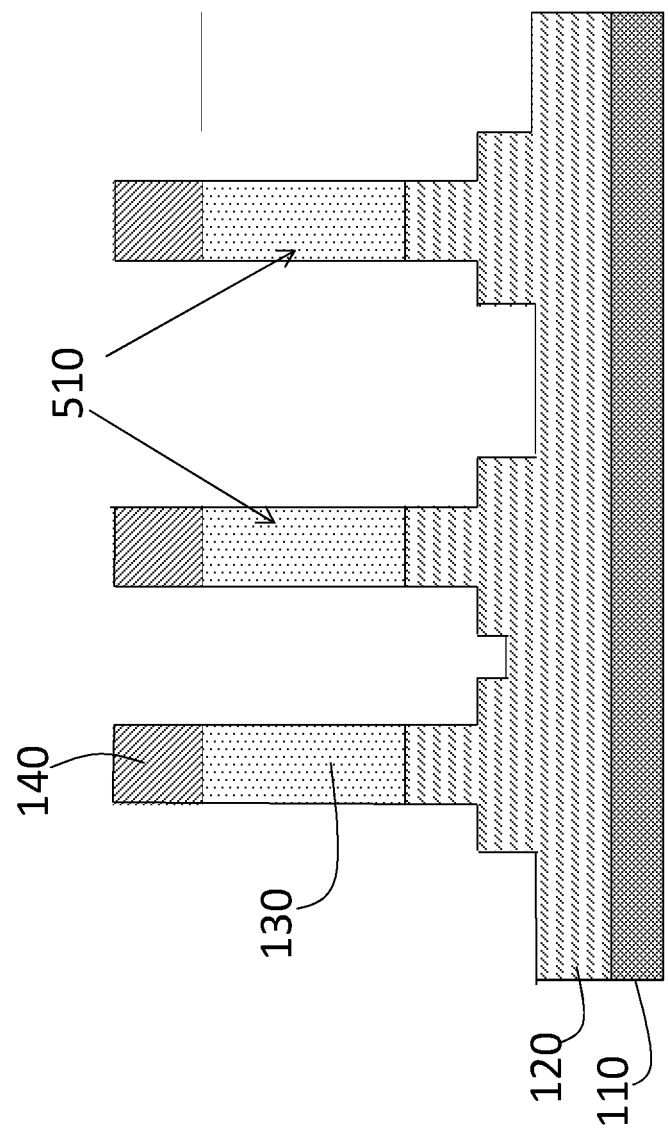

FIG. 9 is a cross-sectional view of the intermediate structure resulting from removal of the hard mask 610 adjacent to each fin 510. At this stage, with the uniform fin height achieved, known processes for fabricating a finFET can be continued. While these known processes are not detailed, some of the processes that are specific to the fabrication of a VFET are outlined with reference to FIGS. 10-13.

Figure 10:
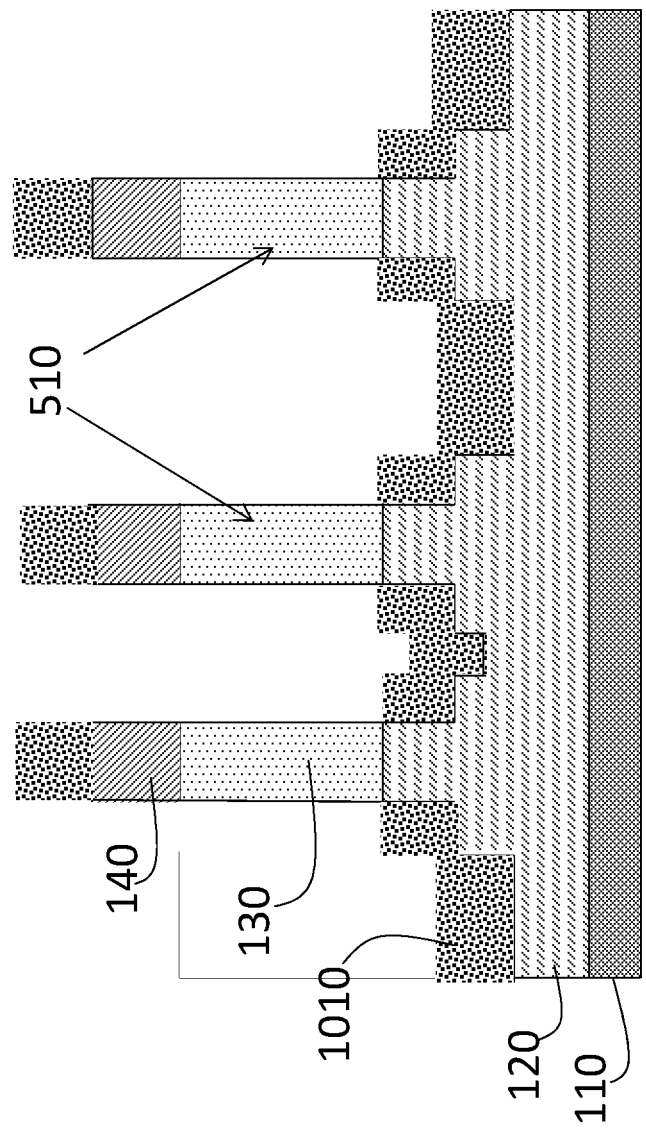
Figure 11:
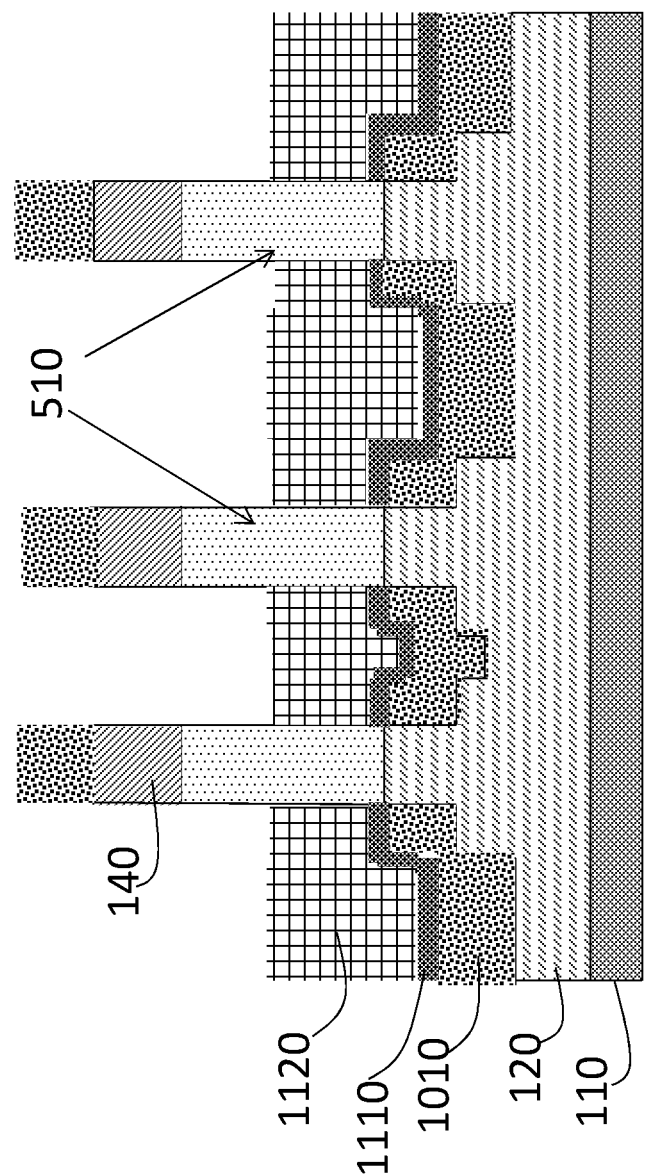
Figure 12:
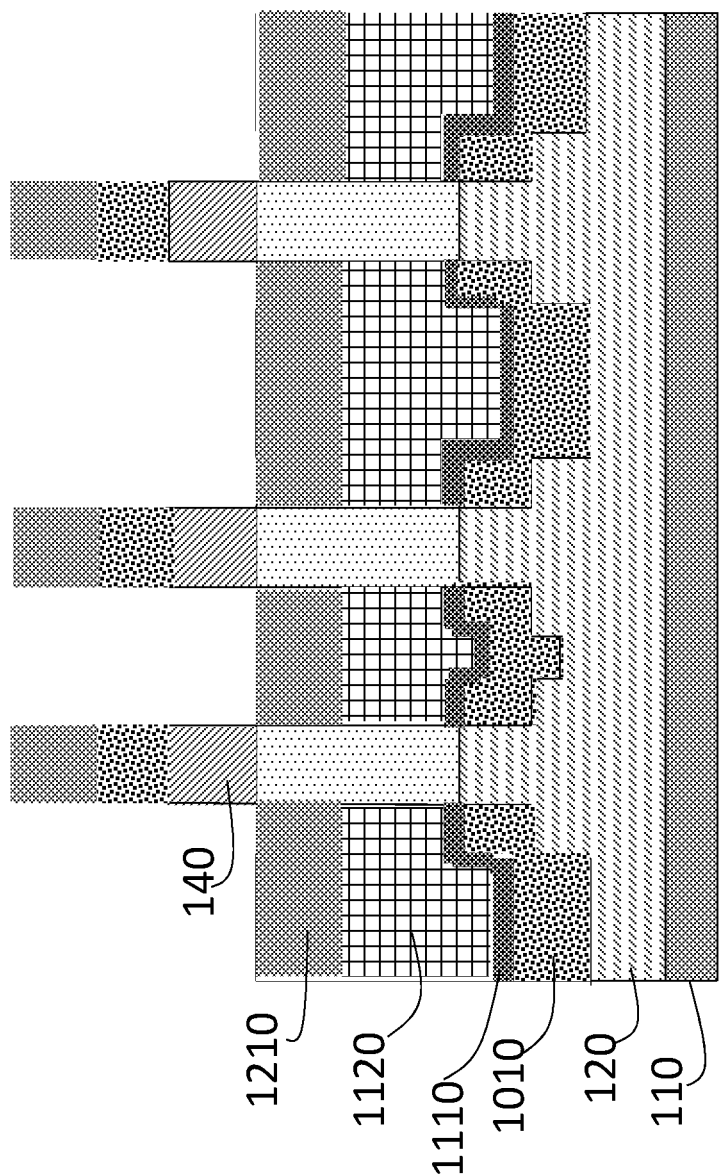
Figure 13:
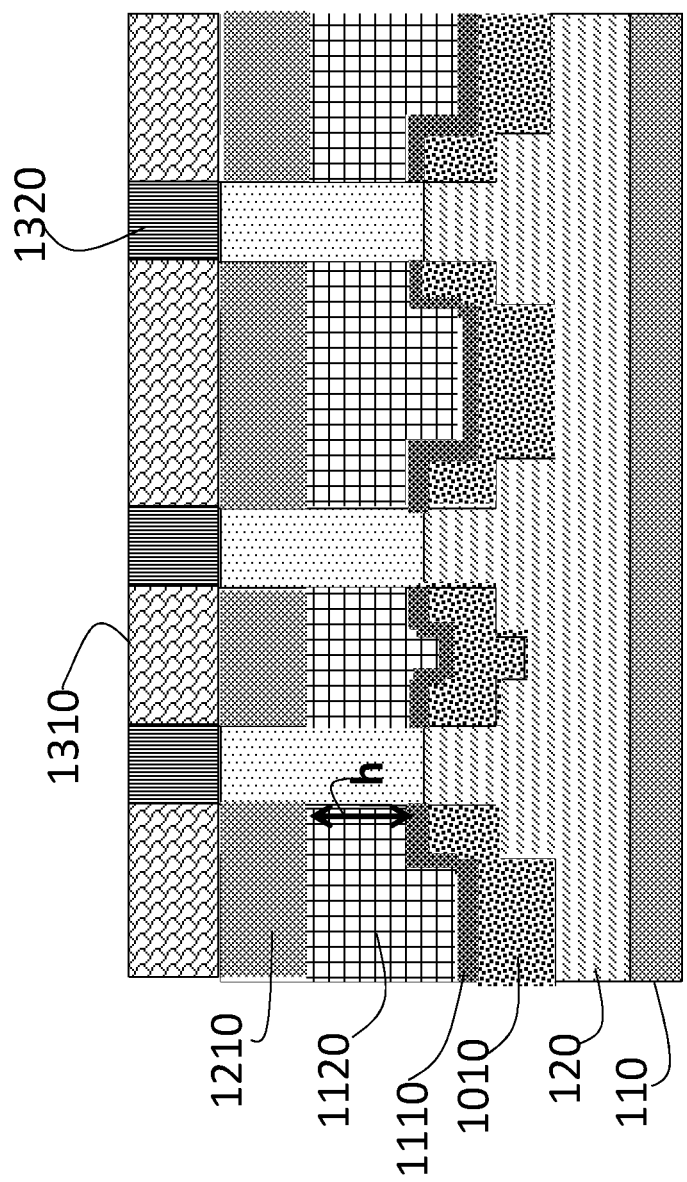

FIG. 10 shows the intermediate structure that results from the formation of a bottom spacer 1010 on the remaining doped layer 120. The bottom spacer 1010 can be silicon boron carbide nitride (SiBCN, SiN or Silicon oxide), for example. A high-k dielectric 1110 is formed on the bottom spacer 1010, and a metal layer 1120 is formed on the high-k dielectric 1110, as shown in FIG. 11. After CMP planarization, metal Gate and high-k are recessed to below Fin top This metal layer 1120 functions as the gate. A top spacer 1210 is formed above the recessed gate metal layer 1110, as shown in FIG. 12. This top spacer 1210 can be the same material (e.g., SiBCN, SiN, Silicon oxide) as the bottom spacer 1010. An interlayer dielectric (ILD) 1310 is then formed (e.g., deposited and a CMP process performed), as shown in FIG. 13, the spacer material and fin hard mask 140 is removed from above the fins 510, and an epitaxial layer 1320 is grown on each of the fins 510. The drain regions or, in alternate embodiments in which the doped layer 120 is the drain region, the source regions associated with each fin 510 are formed in the epitaxial layers 1320.

In FIG. 13, the gate length, which is the indicated gate height h (i.e., the height of the metal layer 1120 between the high-k dielectric 1110 and the top spacer 1210) that is directly adjacent to each side of each of the fins 510, is substantially the same. This is because of the spacers 210 of uniform width that were placed adjacent to the fin hard mask 140 that defined the fin 510 regions.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop. The terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

What is claimed is:

1. A structure of a vertical field effect transistor (VFET), comprising:
   a substrate;
   a doped layer formed on the substrate;
   a top surface of the doped layer being non-uniform;
   a plurality of fins formed above the doped layer, wherein a space between two of the plurality of fins is different than another space between another two of the plurality of fins; and
   gate metal adjacent to each side of each of the plurality of fins, wherein a height of the gate metal directly adjacent to each side of each of the plurality of fins is substantially the same.

2. The structure according to claim 1, further comprising an epitaxial layer formed above each of the plurality of fins.

3. The structure according to claim 2, wherein the doped layer is a source region of the VFET.

4. The structure according to claim 3, wherein the epitaxial layer formed above each of the plurality of fins is a drain region.

5. The structure according to claim 2, wherein the doped layer is a drain region of the VFET.

6. The structure according to claim 5, wherein the epitaxial layer formed above each of the plurality of fins is a source region.

7. The structure according to claim 1, further comprising bottom spacers formed on the top surface of the doped layer.

8. The structure according to claim 7, further comprising a high-k dielectric layer formed conformally on the bottom spacers.

9. The structure according to claim 8, wherein the gate metal is formed on the high-k dielectric layer.

10. The structure according to claim 9, further comprising top spacers formed on the gate metal.

11. The structure according to claim 10, wherein the gate height is defined by the high-k dielectric layer and the top spacers.

12. The structure according to claim 10, wherein the top spacers are formed from silicon boron carbide nitride (SiBCN), silicon nitride (SiN), or silicon oxide.

13. The structure according to claim 10, further comprising interlayer dielectric (ILD) layers formed on the top spacers.

14. The structure according to claim 7, wherein the bottom spacers are formed from silicon boron carbide nitride (SiBCN), silicon nitride (SiN), or silicon oxide.

15. The structure according to claim 1, wherein the substrate is silicon.

16. The structure according to claim 1, wherein the substrate is a III-V compound semiconductor.

17. The structure according to claim 1, wherein the substrate is an organic semiconductor or a layered semiconductor.

18. The structure according to claim 17, wherein the substrate is silicon on silicon Germanium (Si/SiGe), a silicon-on-insulator, or a SiGe-on-insulator.

19. The structure according to claim 1, wherein the substrate is a hybrid oriented (HOT) semiconductor substrate.

20. The structure according to claim 1, wherein the plurality of fins is formed from silicon, germanium, silicon germanium, silicon carbide, or III-V compound semiconductors.

* * * * *